(12) United States Patent
Kitagawa (10) Patent No.: US 7,277,264 B2
(45) Date of Patent: Oct. 2, 2007

(54) SEMICONDUCTOR INTEGRATED CIRCUIT HAVING CURRENT DETECTION FUNCTIONALITY AND POWER SUPPLY UNIT EQUIPPED WITH THE SAME

(75) Inventor: Atsushi Kitagawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 256 days.

(21) Appl. No.: 11/083,699

(22) Filed: Mar. 18, 2005

(65) Prior Publication Data

US 2005/0213275 A1 Sep. 29, 2005

(30) Foreign Application Priority Data

Mar. 26, 2004 (JP) ............................. 2004-090952

(51) Int. Cl.
*H02H 9/02* (2006.01)
(52) U.S. Cl. .................................................. 361/93.1
(58) Field of Classification Search ............... 361/93.1, 361/93.7
See application file for complete search history.

(56) References Cited

U.S. PATENT DOCUMENTS 6,150,714 A * 11/2000 Andreycak et al. ......... 257/690
6,326,771 B1 * 12/2001 Popescu-Stanesti ......... 320/139
6,492,845 B1 * 12/2002 Ge et al. ...................... 327/53
6,946,862 B2 * 9/2005 Kosuga ....................... 324/763

FOREIGN PATENT DOCUMENTS

JP       2001-053120       2/2001

* cited by examiner

*Primary Examiner*—Stephen W. Jackson
*Assistant Examiner*—Scott Bauer
(74) *Attorney, Agent, or Firm*—Hogan & Hartson LLP (57) ABSTRACT

A semiconductor IC has a current detection resistor and a comparison circuit for comparing the voltage drop across the current detection resistor with a threshold voltage to detect a possibly large magnitude of current passing through the current detection resistor. The semiconductor IC has a current terminal for externally inputting current to the current detection resistor, a highly resistive current-limiting resistor connected between the current detection resistor and one input end of the comparison circuit, and a measurement terminal connected to the node of the input terminal of the comparison circuit and the current limiting resistor. Thus, the magnitude of the current flowing through the measurement resistor is correctly measured without being influenced by the parasitic resistances of the terminals or of the test probe used. The threshold level of detection current is regulated based on the measured level the detection current without flowing therethrough a large amount of current nor implementing any additional device.

14 Claims, 5 Drawing Sheets

SEMICONDUCTOR INTEGRATED CIRCUIT HAVING CURRENT DETECTION FUNCTIONALITY AND POWER SUPPLY UNIT EQUIPPED WITH THE SAME

FIELD OF THE INVENTION

This invention relates to a semiconductor integrated circuit (IC) having current detection functionality for detecting the magnitude of current flowing through a circuit associated with the semiconductor IC to protect the semiconductor IC and the external circuit.

The invention also relates to a power supply unit equipped with such semiconductor IC.

BACKGROUND OF THE INVENTION

Figure 5:
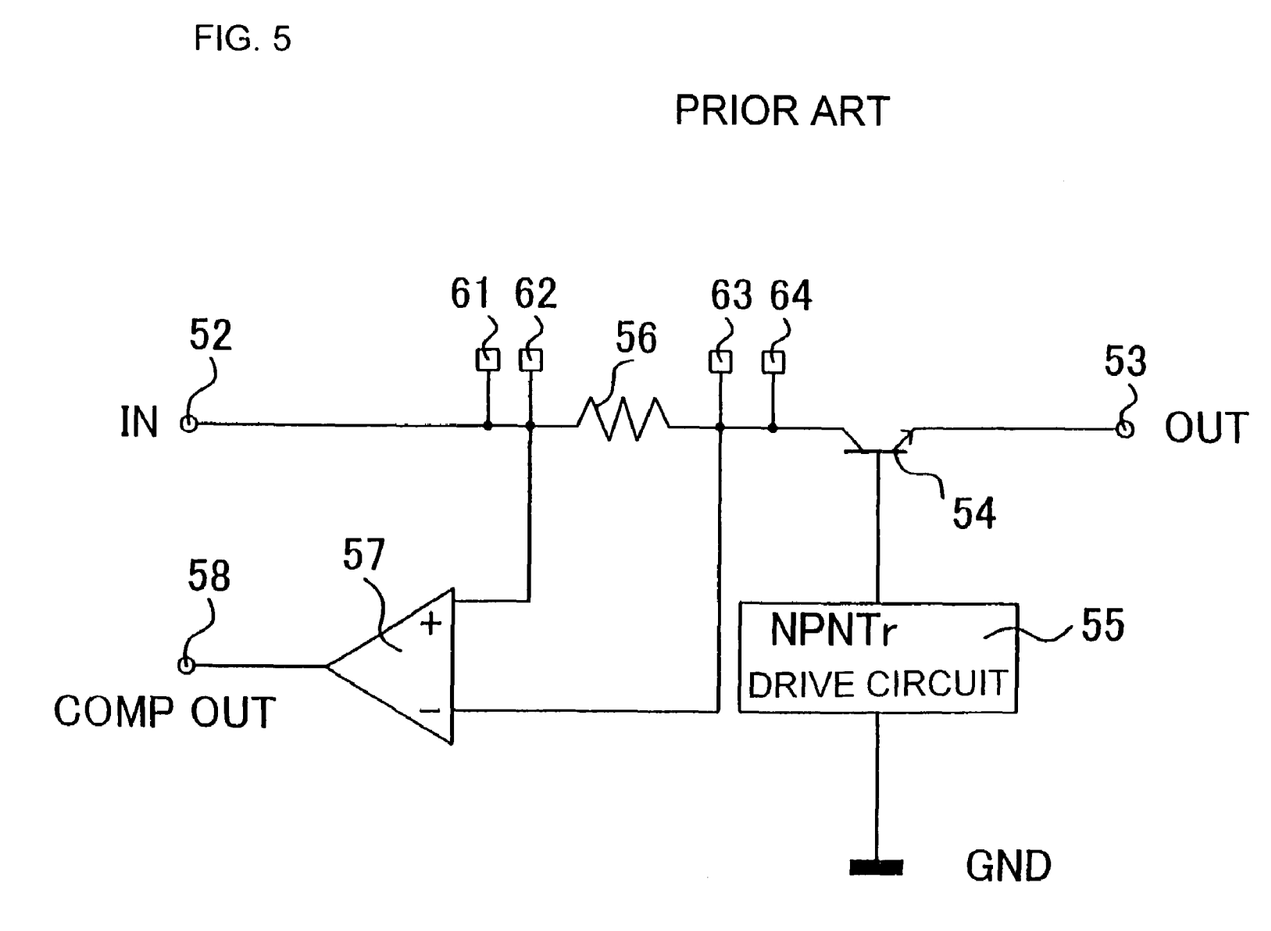
FIG. 5 shows a structure of a conventional semiconductor IC having over-current detection functionality.

A typical semiconductor IC for use in a power device (referred to as power device semiconductor IC) has an over-current detection function as shown in FIG. 5. Such power device semiconductor IC is used in power circuits and output circuits of different kinds of apparatuses. A power device semiconductor IC is designed to detect over-current that flows in a power device and, if over-current is detected, limit the current to protect the internal as well as external circuitries from being damaged by the over-current. The power device semiconductor IC is required to provide operational security and several sophisticated operational features including: operational accuracy; dormancy under normal operating conditions; and capability of protective operation when over-current exceeds a predetermined level. In addition, the power device semiconductor IC is preferred to be inexpensive as other electronic components.

The semiconductor IC shown in FIG. 5 has a current input terminal 52 and a current output terminal 53 respectively connected to the collector and the emitter of a power NPN transistor 54. The base of the power NPN transistor 54 is controlled by an NPN Tr drive circuit 55. When for example the power NPN transistor 54 and the NPN Tr drive circuit 55 are used in an output circuit, they amplify the signal input into the NPN Tr drive circuit 55 and provide at the current output terminal 53 stable amplified power that is constant in voltage or current.

The magnitude of the current output from the emitter of the power NPN transistor 54 to the current output terminal 53 is substantially equal to that of the current input to the collector of the power NPN transistor 54 via the current input terminal 52. Over-current detection functionality for limiting this current within a predetermined range can be attained by a resistor 56 and a comparator 57. The resistor 56 is provided to determine the magnitude of the current that flows from the current input terminal 52 to the collector of the power NPN transistor 54. The resistor 56 generates a voltage drop in accord with the magnitude of the current.

The voltage across the power NPN transistor 54 increases with the collector current of the power NPN transistor 54. When this voltage exceeds the threshold voltage of the comparator 57, the output of the comparator 57 appearing at the output terminal 58 thereof is pulled up from a low level to a high level. This change in the output level is transmitted to the NPN Tr drive circuit 55 to disable the power NPN transistor 54.

In order to improve the accuracy of current detection with the circuit of FIG. 5, it is necessary to accurately or correctly measure the magnitude of current to be detected. Since the current that can be passed through one probe of a tester is limited in magnitude to a small value, it is impossible in a wafer test to directly detect or measure a large over-current.

Then, it is necessary in the wafer test to measure the resistance of (or the voltage drop across) the resistor 56 for a permissible current through the probe and compare the measured voltage drop with the threshold of the comparator 57 to determine the maximum permissible level of over-current. To measure the resistance of the resistor 56, source electrodes 61 and 64 and major electrodes 62 and 63 are formed on the chip of the semiconductor IC. Then the small resistance of the resistor 56 is measured as accurately as possible by flowing current between the source electrodes 61 and 64. This can be done by measuring the voltage between the measurement electrodes 62 and 63; In actuality, however, the threshold voltage of the comparator 57 cannot be accurately measured, since the resistor 56 has only a small resistance and is connected between the input terminals of the comparator 57.

Means for improved accurate measurement of the threshold voltage of the comparator 57 has been disclosed in Japanese Patent Application Laid Open 2001-53120, in which electric connection means such as a Zener diode is provided for cutting off the electric connection between the current detection resistor 56 and one input end of the comparator 57 during a wafer test on over-current detection functionality and for re-establishing the electric connection after the test.

However, the disclosed prior art requires not only an electric connection means such as a Zener diode used only in the wafer test but also two extra terminals for feeding high-voltage pulses to the electric connection means. As a consequence, a semiconductor IC having current detection functionality has a complicated structure and must be structured to withstand high-voltage pulses, which increases the cost of the IC.

SUMMARY OF THE INVENTION

It is, therefore, an object of the invention to provide a semiconductor IC having a built-in resistor (hereinafter referred to as current detection resistor) for passing therethrough current to be detected (referred to as detection current), especially detection current having a large magnitude, the semiconductor IC being cap able of:

correctly measuring the resistance of the current detection resistor without being influenced by the resistances of terminals of the IC and a test probe used;

actually measuring the threshold level of the detection current (or threshold voltage) without flowing a large amount of current through the detection resistor or implementing any further device; and adjusting the threshold level of the detection current based on the measured detection current.

It is another object of the invention to provide a power supply unit equipped with such semiconductor IC as described above.

In accordance with one aspect of the invention, there is provided a semiconductor IC having a current detection resistor for passing therethrough detection current and a comparison circuit for comparing the voltage associated with the voltage drop across the current detection resistor with a threshold voltage to determine the magnitude of the detection current, the semiconductor IC thus implementing current detection functionality, the semiconductor IC comprising:

a current terminal for externally feeding current to the current detection resistor;

a current limiting resistor connected between the current terminal and one input end of the comparison circuit and having a higher resistance than the current detection resistor; and a measurement terminal connected to the node of the one input end of the comparison circuit and the current limiting resistor.

In accordance with another aspect of the invention, there is provided a semiconductor IC having a current detection resistor for passing therethrough detection current and a comparison circuit for comparing the voltage associated with the voltage drop across the current detection resistor with a threshold voltage to determine the magnitude of the detection current, the semiconductor IC thus implementing current detection functionality, the semiconductor IC comprising:

a first current terminal;

a second current terminal for flowing therethrough the detection current from the first current terminal via the current detection resistor;

a current limiting resistor connected between one end of the current detection resistor and a first input end of the comparison circuit, and having a resistance higher than that of the current detection resistor; and a first measurement terminal connected to the node of the first input terminal and current limiting resistor.

The semiconductor IC may have a second measurement terminal, connected to the other end of the current detection resistor, for outputting the same output power as from the second current terminal.

In accordance with another aspect of the invention, there is provided semiconductor IC having a current detection resistor for passing therethrough detection current and a comparison circuit for comparing the voltage associated with the voltage drop across the current detection resistor with a threshold voltage to determine the magnitude of the detection current, the semiconductor IC thus implementing current detection functionality, the semiconductor IC comprising:

a first current terminal;

a second current terminal for flowing therethrough the detection current from the first current terminal via the current detection resistor;

a first current limiting resistor connected between one end of the current detection resistor and a first input end of the comparison circuit, and having a resistance higher than that of the current detection resistor;

a first measurement terminal connected to the node of the first input terminal and a first current limiting resistor;

a second current limiting resistor connected between the other end of the current detection resistor and a second input end of the comparison circuit, and having a resistance higher than that of the current detection resistor; and a second measurement terminal connected to the node of the second input terminal and second current limiting resistor.

In any of those semiconductor ICs, the comparison circuit may be adapted to adjust the threshold voltage to be in accord with a predetermined magnitude of the detection current. Furthermore, the comparison circuit may include a differential amplifier having much higher input impedance than the current limiting resistor, and a comparator for comparing the output of the differential amplifier with a reference voltage. The reference voltage can be adjusted by a voltage regulation member that can be trimmed (the member hereafter referred to as trimable voltage regulation member).

The power supply unit may comprise a voltage conversion circuit for converting an input voltage into a predetermined output voltage and a semiconductor IC having current detection functionality to determine the magnitude of the current that flows through the voltage conversion circuit.

In accordance with a still further aspect of the invention, there is provided a power supply unit equipped with a semiconductor IC having a current detection resistor for passing therethrough detection current and a comparison circuit for comparing the voltage associated with the voltage drop across the current detection resistor with a threshold voltage to determine the magnitude of the detection current, the semiconductor IC thus implementing current detection functionality, the semiconductor IC further having:

a first current terminal;

a second current terminal for flowing therethrough the detection current from the first current terminal via the current detection resistor;

a current limiting resistor connected between one end of the current detection resistor and a first input end of the comparison circuit, and having a higher resistance than the current detection resistor; and a first measurement terminal connected to the node of the first input terminal and current limiting resistor; and a second measurement terminal, connected to the other end of the current detection resistor, for providing the same output power as from the second current terminal, wherein the second current terminal and second measurement terminal are also connected together outside the semiconductor IC.

An inventive semiconductor IC having a built-in current detection resistor is capable of detecting current of a large magnitude as described above. The semiconductor IC can correctly measure the resistance of the current detection resistor without being influenced by the resistances of terminals or the resistance of the test probe used, and can actually measure the threshold level of the detection current without flowing a large current through the current detection resistor or implementing any additional means. Thus, the current detection functionality of the semiconductor IC can be provided easily and correctly in the stage of manufacturing its wafer.

It will be appreciated that the resistance of the current detection resistor can be accurately measured without being influenced by the resistances of the test probe or of the terminals involved. Since the current detection resistor consists of low-resistance wires such as aluminum wires, it is especially advantageous that the inventive semiconductor IC can accurately and exclusively measure the resistance of the current detection resistor.

Moreover, based on the correctly measured resistance of this current detection resistor and a prospective current detection, the threshold voltage of the comparison circuit can be finely tuned to an optimal value.

Since the resistance of the current limiting resistor is only required to be sufficiently larger than that of the current detection resistor and needs not be precise, formation of the resistor is easy.

In actual usage of the semiconductor IC, the second current terminal and the second measurement terminal can be connected in parallel with each other to reduce the resistance of the terminals to reduce the power loss by them.

DETAILED DESCRIPTION OF THE PREFERRED EMBODIMENT

Figure 1:
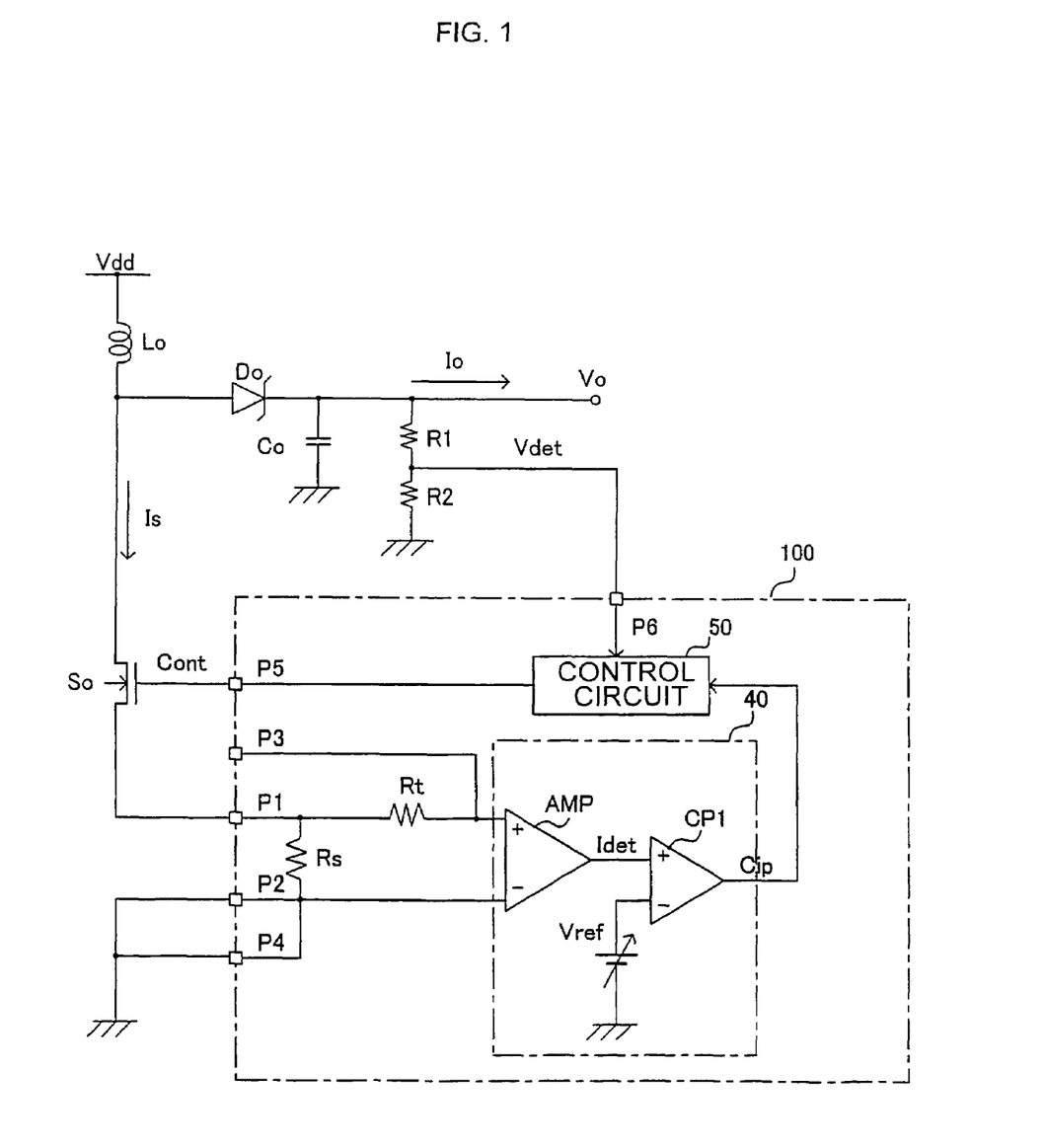
FIG. 1 shows a structure of a power supply unit equipped with a semiconductor IC having current detection functionality in accordance with one embodiment of the invention.

An inventive semiconductor IC having current detection functionality and a power supply unit utilizing such semiconductor IC will now be described in detail with reference to the accompanying drawings. Referring to FIG. 1, there is shown structures of an inventive power supply unit and a semiconductor IC for use with the power supply unit.

In the example shown in FIG. 1, a step-up type switching power supply unit is used. The invention, however, is not limited to this type of power supply unit, and can be also applied to other devices having current detection functionality including a step-down type power supply unit, serial power supply unit, a power supply unit, and to a motor drive unit as well.

As shown in FIG. 1, a coil Lo and an NMOS transistor switch So are connected in series with each other between a power source and the ground. The voltage, stepped up from a power supply voltage Vdd and appearing at the node of the coil Lo and the NMOS transistor So, is rectified and smoothed by a Schottky diode Do and a smoothing capacitor Co to generate an output voltage Vo. Io indicates output current to be supplied to a load (not shown). The switch element So can be a MOS transistor or a bipolar transistor.

The output voltage Vo is divided by voltage division resistors R1 and R2 to form a voltage detection signal Vdet. The ratio of on- to off-periods (referred to as on-off ratio) of the NMOS transistor So is controlled based on the voltage detection signal Vdet to thereby maintain the output voltage Vo at a predetermined level.

Controlled on-off operation of the NMOS transistor So results in switching current (referred to as detection current) Is through the coil Lo. The detection current Is is controlled not to exceed a predetermined level by monitoring the magnitude of the detection current.

These constant voltage operation and current limiting operation are performed by a semiconductor IC 100. The voltage detection signal Vdet is input into a control circuit 50 via a voltage input terminal P6. The control circuit 50 compares the voltage detection signal Vdet with a reference voltage to generate a switching control signal Cont, which is supplied to the gate of the NMOS transistor So via a control terminal P5. Thus, the output voltage Vo is held at a predetermined level.

The current limiting operation is attained by feeding the output (referred to as comparison output) Cip of a comparison circuit 40 to a control circuit 50. The control circuit 50 may be provided outside the semiconductor IC 100. In this case, the semiconductor IC 100 does not need the control terminal P5 or the power input terminal P6, and needs only a terminal (referred to as comparison output terminal) for outputting the comparison output Cip in place of the terminals P5 and P6.

The current detection resistor Rs is connected between first and second current terminals P1 and P2, respectively, of the semiconductor IC 100. The voltage drop across the current detection resistor Rs created by the detection current Is flowing therethrough is compared with a reference voltage Vref in the comparison circuit 40. The current detection resistor Rs has a very low resistance (e.g. about 0.1 Ohm) to allow for a big detection current Is (e.g. about 2 A) through it during the use of the power supply unit. This current detection resistor Rs is formed simultaneously with other metal lead wires (aluminum leads) on the surface of the semiconductor chip in the process of manufacturing the semiconductor IC. Thus, the current detection resistor Rs can be easily formed at a low cost, since it is formed in the semiconductor IC. Moreover, it has high operational stability, since it is built in the semiconductor IC itself and hence inside the package thereof.

Connected between one end of the current detection resistor Rs and the one input end of the comparison circuit 40 is a current limiting resistor Rt. The node of this current limiting resistor Rt and the input end of the comparison circuit 40 is connected to a first measurement terminal P3. This current limiting resistor Rt has an exceedingly high resistance (e.g. about 20 kilo-Ohms) as compared with the resistance of the current detection resistor Rs. The current limiting resistor Rt suffices to have a sufficiently high resistance, that is, it requires no precision in resistance. The first measurement terminal P3 is used only in the measurement of the resistance of the current detection resistor Rs and the threshold voltage of the comparison circuit 40, so that it is left open in the normal operation of the semiconductor IC. That is, it is not connected to any external device then. Because the first measurement terminal P3 is open under normal operating conditions, the voltage drop across the current detection resistor Rs can be solely detected. The input impedance of the comparison circuit 40 preferably has an exceedingly higher resistance than the current detection resistor Rs.

The second measurement terminal P4 is used in the measurement of the resistance of the current detection resistor Rs and the threshold voltage of the comparison circuit 40. The second measurement terminal P4 is connected in parallel with the second current terminal P2 in the normal operation. Thus, the detection current Is is shunted to the second current terminal P2 and the second measurement terminal P4 in the normal operation, thereby reducing the power loss by the resistor Rs.

In the example shown herein, the comparison circuit 40 is provided with a differential amplifier AMP and a comparator CP1. The differential amplifier AMP amplifies the voltage across the two input terminals thereof, and outputs a current detection signal Idet. The differential amplifier AMP preferably has high impedance at the input end thereof. This preference is achieved by, for example, a differential amplifier AMP having MOS transistors as its input ends.

The comparator CP1 compares the input current detection signal Idet with the reference voltage (which is a threshold voltage adjusted so as to detect a predetermined current level, hereinafter also referred to as current detection threshold voltage) Vref, and outputs the comparison output Cip. The reference voltage Vref may be adjusted to have a desired magnitude by trimming a trimable voltage adjustment member by, for example, selecting an appropriate combination of voltage dividing resistors and fusible elements such as fuses.

In the power supply unit of FIG. 1, the control circuit 50 performs constant voltage operation in which the output voltage Vo is maintained at a predetermined constant level by controlling the on-off ratio of the NMOS transistor So based on the voltage detection signal Vdet.

It is noted that the detection current Is flows through the current detection resistor Rs and that the voltage drop across the current detection resistor Rs determined by the resistance of the resistor and the detection current is amplified by the differential amplifier AMP to output the current detection signal Idet, which is compared with the reference voltage Vref. When the current detection signal Idet stays below the reference voltage Vref, a constant voltage operation is performed, since the comparison output Cip is not output then.

However, if the current detection signal Idet reaches the level of the reference voltage Vref, the comparison output Cip will be output from the comparator CP1 to the control circuit 50. In response to the comparison output Cip, the control circuit switches from the constant voltage operation to current limiting operation. This current limiting operation may be attained by causing the power supply unit to be disabled or to operate under a limited operating current.

In order to carry out this current limiting operation with a predetermined detection current Is, it is necessary that the resistance of the current detection resistor Rs is known correctly and that the reference voltage Vref is set to a proper level in accord with the predetermined detection current Is and the resistance Rs.

Figure 2:
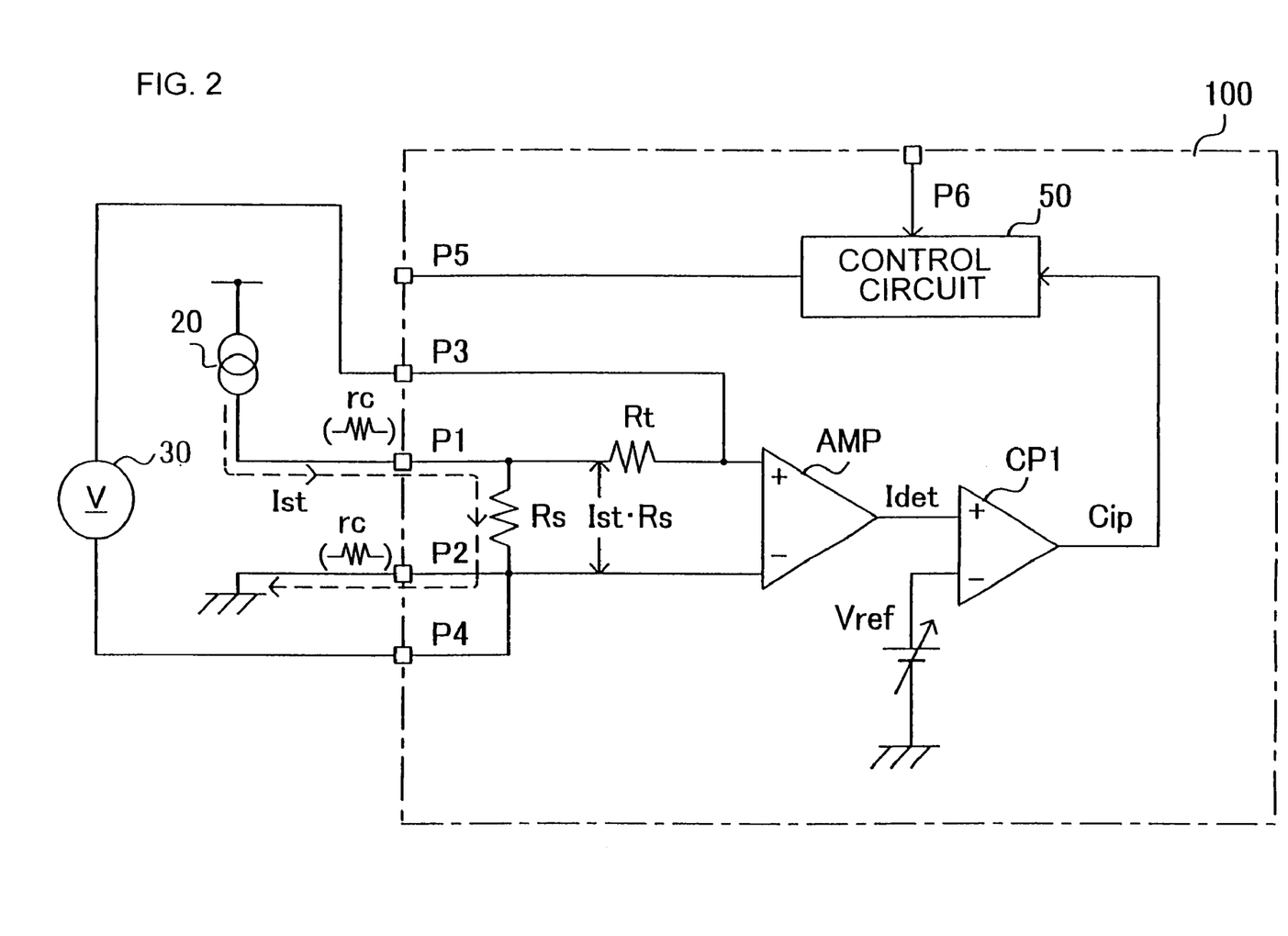
FIG. 2 shows how the resistance of a current detection resistor of FIG. 1 is measured using the current detection functionality.
Figure 3:
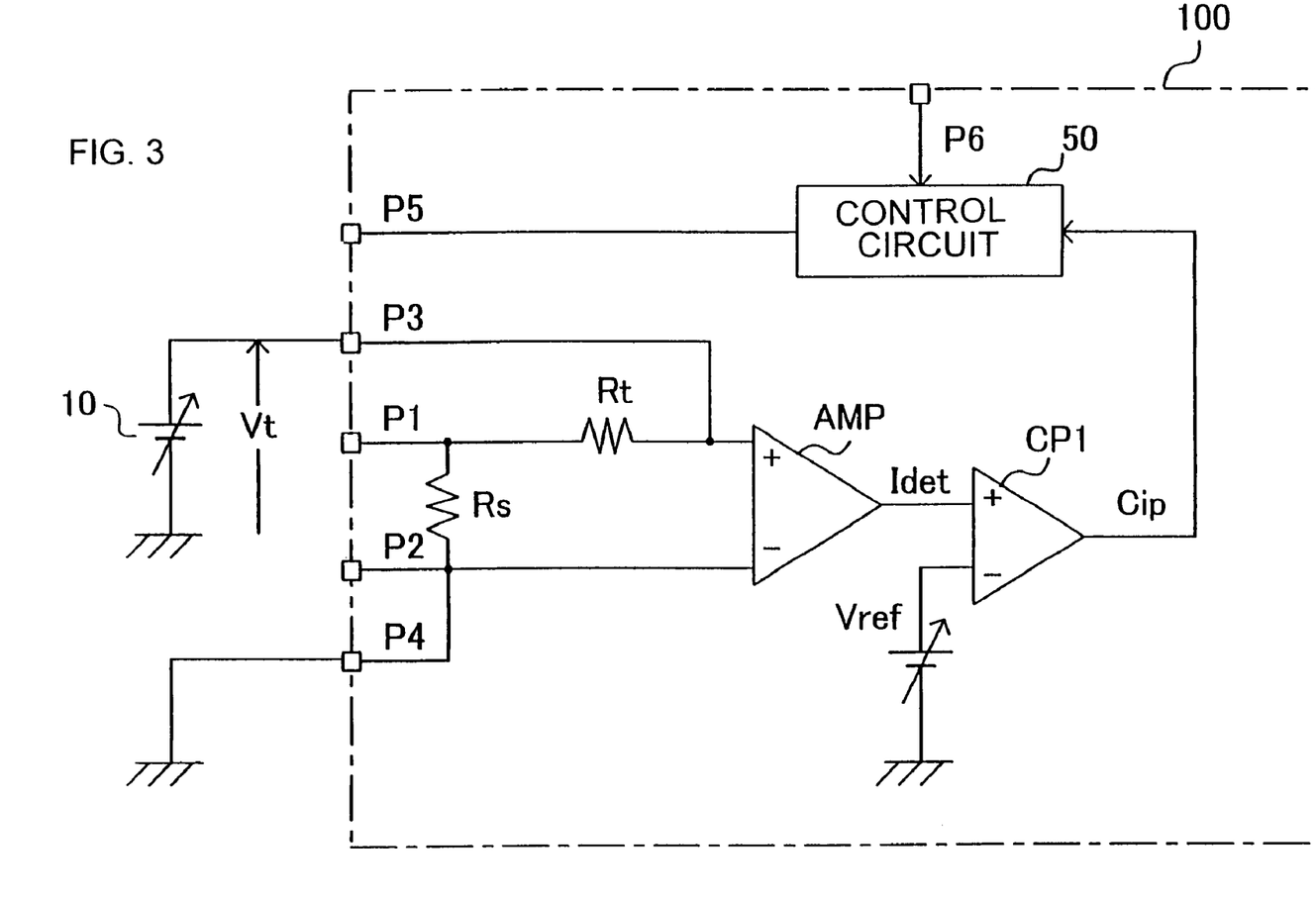
FIG. 3 shows how the threshold of a reference voltage is measured for the semiconductor IC of FIG. 1.

In the inventive semiconductor IC, the resistance of the current detection resistor Rs and the threshold level of the reference voltage Vref can be measured using an ordinary tester (typically a probe that permits current of at most about 200 mA) under wafer state. FIGS. 2 and 3 show conditions of the semiconductor IC in these measurements.

Referring to FIG. 2, there is shown a circuit arrangement for measuring the resistance of the current detection resistor Rs. As seen in FIG. 2, the second current terminal P2 is connected to the ground with a probe, and the output end of a current source 20 of a measuring apparatus is connected to the first current terminal P1 with another probe. The measurement current Ist from the current source 20 is very small (as small as about 100 mA) as compared with the detection current Is (which is about 2 A for example). On the other hand, voltage measurement means, e.g. a voltmeter 30, is connected between the first measurement terminal P3 and the second measurement terminal P4.

The measurement current Ist from the current source 20 flows through the first current terminal P1, the current detection resistor Rs, and the second current terminal P2, as indicated by a broken line in FIG. 2. Resistances of the first and second current terminals P1 and P2 and the contact resistances between these terminals and the probes found in the path of the measurement current Ist are collectively indicated by symbols rc. In the invention, although these resistances rc are larger than that of the current detection resistor Rs, they do not affect the measurements by the voltmeter 30, as described below. Moreover, since both the input impedances of the differential amplifier AMP and the voltmeter 30 are very high, they do not affect the measurements by the voltmeter 30.

That is, the measurements with the voltmeter 30 permits correct determination of the magnitudes of the current Ist and the current detection resistor Rs.

Next, referring to FIG. 3, there is shown a circuit arrangement for measuring the threshold level of the reference voltage Vref. As seen in FIG. 3, a variable voltage source 10 is connected between the first and the second measurement terminals P3 and P4, respectively. The variable voltage source 10 is adapted to sweep the voltage across the terminals P3 and P4 (the voltage referred to as measurement voltage) Vt over a range. The variable voltage source 10 can be any variable voltage source capable of measuring its voltage Vt, or any variable voltage source accompanying means for measuring the voltage Vt. In the example shown herein, the variable voltage source 10 is provided in the same test device together with the current source 20 and the voltmeter 30.

The resistance of the current detection resistor Rs is correctly measured in the manner as already described above in connection with FIG. 2. The product of the desired limiting detection current Is and the measured resistance of the current detection resistor Rs is the target threshold voltage to obtain desired comparison output Cip from the comparison circuit 40. The contact resistances of the first and second measurement terminals P3 and P4, respectively, are negligibly small as compared with the resistance of the current limiting resistor Rt.

Thus, a predetermined range over the target threshold voltage is swept by the measurement voltage Vt of the variable voltage source 10. The comparison output Cip of the comparator CP1 is monitored while sweeping the measurement voltage Vt. The voltage adjustment members of the comparator CP1 are trimmed in accord with the difference between the target threshold voltage and the measurement voltage Vt measured at the time when the desired comparison output Cip is generated, thereby correctly setting the reference voltage (detection threshold voltage) Vref to the target threshold voltage.

In the first embodiment, the resistance of the built-in current detection resistor Rs can be accurately measured without being influenced by the resistances of the first and second current terminals P1 and P2 and the test probe. Further, the detection threshold voltage Vref can be set to an optimal value based on the actually measured voltage drop without flowing a large detection current Is. It is therefore easy to provide a semiconductor IC with proper current detection functionality in the process of forming a wafer of the IC.

The current limiting resistor Rt can be easily fabricated, since the resistor suffices to have a resistance that is significantly higher than that of the current detection resistor Rs and does not need to have a precise magnitude.

It will be appreciated that the resistances of, and hence the power loss by, the measurement terminals are reduced when the semiconductor IC is in actual use by connecting in parallel the second current terminal P2 with the second measurement terminal P4 while leaving the first measurement terminal P3 open to solely detect the voltage drop across the current detection resistor Rs.

Although the invention has been described above with reference to a particular comparison circuit 40 having a differential amplifier AMP and a comparator CP1, it will be clear to a person skilled in the art that the invention is applicable to any semiconductor IC having any type of comparison circuit.

Figure 4:
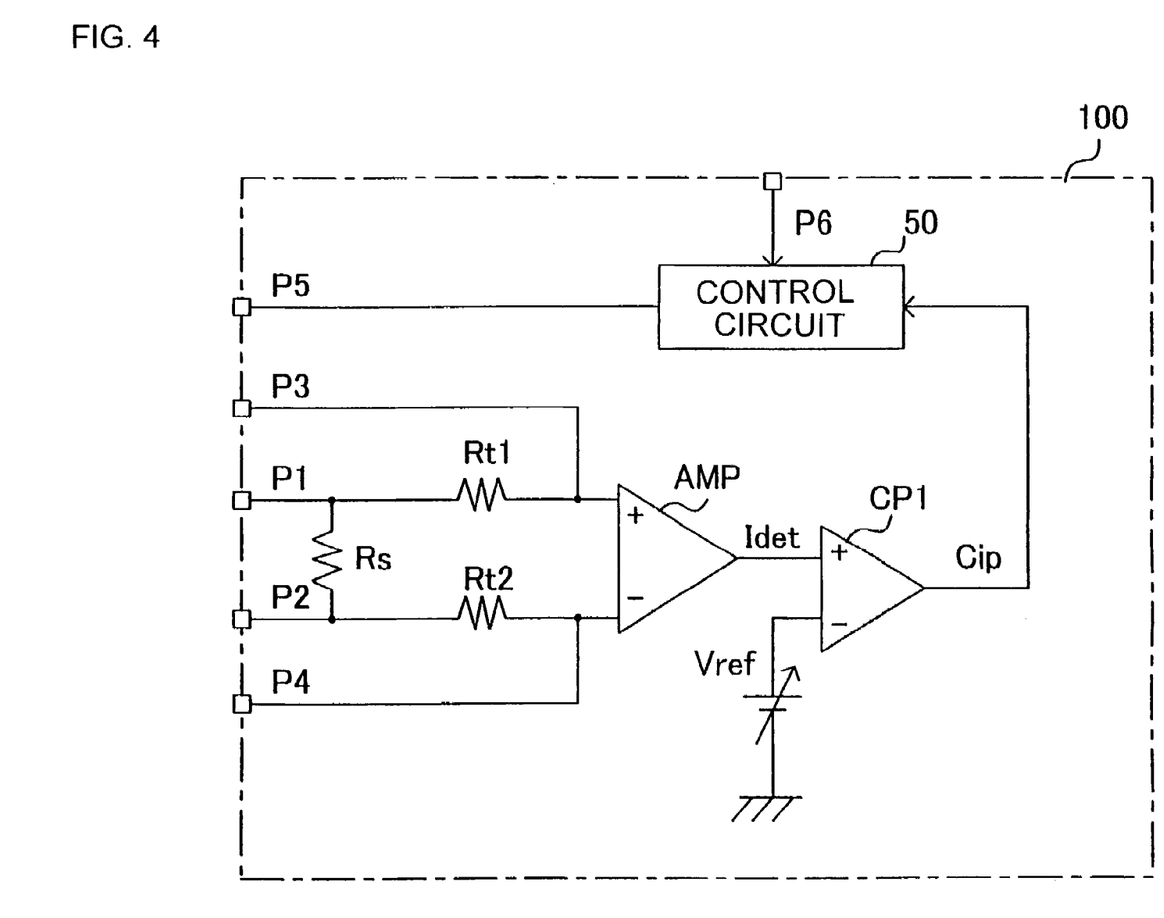
FIG. 4 shows a structure of a semiconductor IC having current detection functionality according to another embodiment of the invention.

Referring to FIG. 4, there is shown a semiconductor IC according to another embodiment of the invention. In the semiconductor IC shown in FIG. 4, a second current limiting resistor Rt2 having a large resistance is also provided between the second current terminal P2 (or one end of the current detection resistor Rs) and the other input end ("minus" terminal) of the differential amplifier AMP. The current limiting resistor Rt of FIG. 1 is indicated by symbol Rt1 in FIG. 4.

In this case, the second measurement terminal P4 is connected to the node of the other input end of the differential amplifier AMP and the second current limiting resistor Rt2. Other features of the circuit are the same as those of FIG. 1.

In the example shown in FIG. 4, the two inputs to the differential amplifier AMP can be equilibrated. However, the second current terminal P2 and the second measurement terminal P4 cannot be connected with each other as shown in FIG. 1 when the IC is in actual use. As a consequence, power loss will be slightly larger in this circuit than in the circuit of FIG. 1.

It will be noted that one or both of the second current terminal P2 and the second measurement terminal P4 can be omitted in the embodiments shown in FIGS. 1 and 2 when a further ground terminal is available.

I claim:

1. A semiconductor IC having a current detection resistor for passing therethrough detection current and a comparison circuit for comparing the voltage associated with the voltage drop across said current detection resistor with a threshold voltage to detect the excess of the magnitude of said detection current, said semiconductor IC thus implementing current detection functionality, said semiconductor IC comprising:
   a current terminal, connected to one end of said current detection resistor, for externally feeding said detection current to said current detection resistor;
   a current limiting resistor having one end connected to said current terminal and the other end connected to one input end of said comparison circuit, and having a higher resistance than said current detection resistor; and
   a measurement terminal connected to the node of said one input end of said comparison circuit and other end of current limiting resistor, but not connected to any internal circuit other than said node and not connected to anywhere external when detecting said detection current.

2. The semiconductor IC according to claim 1, wherein said comparison circuit is adapted to regulate said threshold voltage to be in accord with a predetermined magnitude of said detection current.

3. The semiconductor IC according to claim 2, wherein said comparison circuit includes a differential amplifier having a much higher input impedance than said current limiting resistor, and a comparator for comparing the output of said differential amplifier with a reference voltage that can be adjusted by a trimable voltage regulation member.

4. A semiconductor IC having a current detection resistor for passing therethrough detection current and a comparison circuit for comparing the voltage associated with the voltage drop across said current detection resistor with a threshold voltage to detect the excess of the magnitude of said detection current, said semiconductor IC thus implementing current detection functionality, said semiconductor IC comprising:
   a first current terminal, connected to one end of said current detection resistor, for externally feeding said detection current to said current detection resistor;
   a second current terminal, connected to other end of said current detection resistor and second input terminal of said comparison circuit, for flowing therethrough said detection current from said current detection resistor to external;
   a current limiting resistor having one end connected to said first current terminal and other end connected to a first input end of said comparison circuit, and having a higher resistance than said current detection resistor; and
   a first measurement terminal connected to the node of said first input terminal of said comparison circuit and the other end of said current limiting resistor, but not connected to any internal circuit other than said node and not connected to anywhere external when detecting said detection current.

5. The semiconductor IC according to claim 4, wherein said comparison circuit is adapted to regulate said threshold voltage to a predetermined level of said detection current.

6. The semiconductor IC according to claim 5, wherein said comparison circuit includes a differential amplifier having a much higher input impedance than said current limiting resistor, and a comparator for comparing the output of said differential amplifier with a reference voltage that can be adjusted by a trimable voltage regulation member.

7. The semiconductor IC according to claim 4, further comprising a second measurement terminal, connected to the other end of said current detection resistor, for providing the same output power as from said second current terminal.

8. The semiconductor IC according to claim 7, wherein said comparison circuit is adapted to regulate said threshold voltage to be in accord with a predetermined magnitude of said detection current.

9. The semiconductor IC according to claim 8, wherein said comparison circuit includes a differential amplifier having a much higher input impedance than said current limiting resistor, and a comparator for comparing the output of said differential amplifier with a reference voltage that is adjustable by a trimable voltage regulation member.

10. A semiconductor IC having a current detection resistor for passing therethrough detection current and a comparison circuit for comparing the voltage associated with the voltage drop across said current detection resistor with a threshold voltage to detect the excess of the magnitude of said detection current, said semiconductor IC thus implementing current detection functionality, said semiconductor IC comprising:
    a first current terminal, connected to one end of said current detection resistor, for externally feeding said detection current to said current detection resistor;
    a second current terminal, connected to other end of said current detection resistor, for flowing therethrough said detection current from said current detection resistor to external;
    a first current limiting resistor having one end connected to said first current terminal and other end connected to a first input end of said comparison circuit, and having a higher resistance than said current detection resistor;
    a first measurement terminal, connected to the first node of said first input end of said comparison circuit and the other end of said current limiting resistor, but not connected to any internal circuit other than said first node and not connected to anywhere external when detecting said detection current;
    a second current limiting resistor having one end connected to said second current terminal and other end connected to a second input end of said comparison circuit, and having a higher resistance than said current detection resistor; and a second measurement terminal, connected to the second node of said second input terminal of said second input terminal of said comparison circuit and the other end of said current limiting resistor, but not connected to any internal circuit other than said second node and not connected to anywhere external when detecting said detection current.

11. The semiconductor IC according to claim 10, wherein said comparison circuit is adapted to regulate said threshold voltage to be in accord with a predetermined magnitude of said detection current.

12. The semiconductor IC according to claim 11, wherein said comparison circuit includes a differential amplifier having a much higher input impedance than said current limiting resistor, and a comparator for comparing the output of said differential amplifier with a reference voltage that is adjustable by a trimable voltage regulation member.

13. A power supply unit, comprising:
a voltage conversion circuit for converting an input voltage into a predetermined output voltage; and
a semiconductor IC according to any one of claims 1 through 12, receiving the detection current from said voltage conversion circuit.

14. A power supply unit equipped with a voltage conversion circuit for converting an input voltage into a predetermined output voltage and a semiconductor IC having a current detection resistor for passing therethrough detection current and a comparison circuit for comparing the voltage associated with the voltage drop across said current detection resistor with a threshold voltage to detect the excess of the magnitude of said detection current, said semiconductor IC thus implementing current detection functionality, said semiconductor IC further having:
a first current terminal, connected to one end of said current detection resister, for externally feeding said detection current to said current detection resistor;
a second current terminal, connected to other end of said current detection resistor and the second input terminal of said comparison circuit, for flowing therethrough said detection current, from said current detection resistor to external;
a current limiting resistor having one end connected to said first current terminal and other end connected to a first input end of said comparison circuit, and having a higher resistance than said current detection resistor;
a first measurement terminal, connected to the node of said first input terminal of said comparison circuit and the other end of said current limiting resistor, but not connected to any internal circuit other than said node and not connected to anywhere external when detecting said detection current;
a second measurement terminal, connected to the other end of said current detection resistor, wherein
said second current terminal and second measurement terminal are also connected together outside said semiconductor IC when detecting said detection current.

* * * * *